United States Patent
Liao et al.

(10) Patent No.: US 8,963,184 B2
(45) Date of Patent: Feb. 24, 2015

(54) PATTERN SUBSTRATE STRUCTURE FOR LIGHT EMITTING ANGLE CONVERGENCE AND LIGHT EMITTING DIODE DEVICE USING THE SAME

(71) Applicant: Genesis Photonics Inc., Tainan (TW)

(72) Inventors: Kuan-Yung Liao, Tainan (TW); Yu-Lien Yang, Tainan (TW); Yen-Lin Lai, Tainan (TW)

(73) Assignee: Genesis Photonics Inc., Tainan (TW)

( * ) Notice: Subject to any disclaimer, the term of this patent is extended or adjusted under 35 U.S.C. 154(b) by 48 days.

(21) Appl. No.: 13/844,850

(22) Filed: Mar. 16, 2013

(65) Prior Publication Data

US 2013/0277699 A1  Oct. 24, 2013

(30) Foreign Application Priority Data

Apr. 24, 2012 (TW) .............................. 101114574 A

(51) Int. Cl.
| | |
|---|---|
| *H01L 33/00* | (2010.01) |
| *F21K 99/00* | (2010.01) |
| *H01L 33/58* | (2010.01) |
| *H01L 33/02* | (2010.01) |
| *H01L 33/10* | (2010.01) |
| *H01L 33/32* | (2010.01) |

(52) U.S. Cl.
CPC . *F21K 9/50* (2013.01); *H01L 33/58* (2013.01); *H01L 33/02* (2013.01); *H01L 33/105* (2013.01); *H01L 33/10* (2013.01); *H01L 33/32* (2013.01); *H01L 2933/0091* (2013.01)
USPC .............................................. 257/98; 257/91

(58) Field of Classification Search
CPC .............................. H01L 33/10; H01L 33/105
USPC ..................................................... 257/91, 98
See application file for complete search history.

(56) References Cited

U.S. PATENT DOCUMENTS

| | | | | |
|---|---|---|---|---|
| 7,419,912 | B2 * | 9/2008 | Donofrio ....................... | 438/694 |
| 8,258,531 | B2 * | 9/2012 | Cheng et al. ................... | 257/98 |
| 8,564,006 | B2 * | 10/2013 | Tachibana et al. .............. | 257/98 |
| 2002/0123164 | A1 * | 9/2002 | Slater et al. ..................... | 438/39 |
| 2005/0179130 | A1 * | 8/2005 | Tanaka et al. .................. | 257/730 |
| 2011/0278613 | A1 * | 11/2011 | Tu et al. .......................... | 257/98 |

\* cited by examiner

*Primary Examiner* — David Vu
*Assistant Examiner* — Brandon Fox
(74) *Attorney, Agent, or Firm* — Rosenberg, Klein & Lee

(57) ABSTRACT

The present invention provides a pattern substrate structure for light emitting angle convergence and a light emitting diode device using the same. The pattern substrate structure has a plurality of enclosed geometric regions defined by at least three stripe-shaped parts on a substrate to provide the light reflection effect through the uneven surface of the substrate and thereby converge the light emitting angle of the light emitting diode element into 100~110 degrees. Therefore, the illuminant efficiency of the light emitting diode device using the pattern substrate structure is substantially raised because of the improved directivity.

18 Claims, 12 Drawing Sheets

PATTERN SUBSTRATE STRUCTURE FOR LIGHT EMITTING ANGLE CONVERGENCE AND LIGHT EMITTING DIODE DEVICE USING THE SAME

BACKGROUND OF THE INVENTION

1. Field of the Invention

The present invention relates to a pattern substrate structure converging the light emitting angles and a light emitting diode device using the same. More particularly, the present invention relates to a plurality of stripe-shaped parts on the substrate altering a light path and converging a light emitting angle to raise the light directivity and improve the illuminant efficiency of the light emitting diode device.

2. Description of Related Art

In recent years, the light emitting diode has been applied in various technical fields to get more and more popular in the art as well as essential for a human daily life. In addition, the light emitting diode has been gradually substituted for conventional illuminant apparatuses in the next generations. Therefore, developing a high-power, energy-efficient and high-performance light emitting diode has become the trend in the future. The nitride LED is one of the popular semiconductor materials because of its small size, no mercury pollution, high illuminant efficiency, long lifetime and other merits. Also, the illuminant wavelengths of the III-Nitride mostly cover the visible wavelengths so as to show a great potential for use in light emitting diodes.

The structure of a conventional III-Nitride light emitting diode includes a substrate and a n-type semiconductor layer, an active layer and a p-type semiconductor layer formed in sequence on the substrate. In order to increase the current diffusion and light extraction efficiency, there is a transparent conductive layer (ex. Indium Tin Oxide (ITO)) formed on the p-type semiconductor layer, and then a p-type electrode pad and a n-type electrode pad formed on the p-type semiconductor layer and the n-type semiconductor layer with ohmic contacts, respectively. With respect to an ideal light emitting diode, the illuminant efficiency will be 100% when the photons resulted from their recombination with the carriers in the active layer are radiated outward entirely. However, the photons can not be radiated outward entirely during the radiation due is to the optical loss; in such a case, the illuminant efficiency would be reduced.

Further speaking, the strain resulted from the lattice mismatch between the substrate and the epitaxial film of the above light emitting diode often leads to misfit dislocations, parts of which will extend to a crystal surface to form a threading dislocation. For example, an epitaxial Gallium Nitride (GaN) film on a sapphire substrate has a high defect density because of a lattice mismatch of 16% between the sapphire and the GaN film. Generally, there is always a dislocation density of $10^9 \sim 10^{11}$ $cm^{-2}$ to mitigate the crystal quality of the active layer and the quantum efficiency of the light emitting diode, so that the illumination will be decreased and the heat generated therefrom will raise the temperature of the light emitting diode to affect the illuminant efficiency.

In addition, the light of the active layer is radiated outward in multiple directions to provide a light emitting angle between 120 degrees and 140 degrees, which causes a lack of the directivity of the light emitting diode to further deteriorate the illumination, and the large light emitting angle will cause the light from the adjacent light emitting diodes to be interacted and even to be absorbed by the adjacent light emitting diodes after multi-chip package, such that the illuminant efficiency is reduced.

SUMMARY OF THE INVENTION

It is therefore an aspect of the present invention to provide a pattern substrate structure for converging light emitting angles and modifying the light emitting direction through a plurality of stripe-shaped parts formed on a substrate such that the directivity and the illuminant efficiency of the light emitting diode device can be both enhanced.

It is therefore another aspect of the present invention to provide a light emitting diode device at least including the above pattern substrate structure.

In accordance with the foregoing aspects of the present invention, the pattern substrate structure has multiple enclosed geometric regions defined by at least three stripe-shaped parts on a substrate, wherein each enclosed geometric region is in a form of a triangle, a tetragon (e.g. square, rhombus, parallelogram, etc.) or a hexagon. Each of the stripe-shaped parts includes a cross section in a form of a triangle or an arc, wherein the arc has a curvature ranging from $10^{-5}$ $\mu m^{-1}$ to 2.0 $\mu m^{-1}$. In addition, the stripe-shaped parts are formed periodically in the (0001) orientation of the substrate and have the same pitch defined by the distance between every two adjacent stripe-shaped parts in parallel. The pitch ranges from 1 µm and 5 µm.

Furthermore, the substrate is selected from the group consisting of $Al_2O_3$, SiC, Si, GaAs, ZnO and a hexagonal lattice structure material. The stripe-shaped parts are selected from the group consisting of $Al_2O_3$, AlN, SiC, Si and $SiO_2$.

Moreover, each of the stripe-shaped parts has a base plane and two symmetrical laterals relative to the perpendicular bisector of the base plane; thereby, each stripe-shaped part has a height ranging from 0.5 µm to 3.0 µm as well as has a projection distance on the substrate between 1.0 µm and 4.0 µm. A shortest distance between every two adjacent stripe-shaped parts in parallel ranges from 0.1 µm to 1.5 µm. In addition, a shortest distance extending along one of the laterals from the junction line of the two laterals to the base plane is one to five times the shortest distance between every two adjacent stripe-shaped parts in parallel.

In accordance with the foregoing aspects of the present invention, the light emitting diode device at least has the above pattern substrate structure, an epitaxial film composed of III-Nitride semiconductor material grew on the pattern substrate structure and two electrodes for supply of electricity, wherein the epitaxial film further has a n-type semiconductor layer formed on the pattern substrate structure, an active layer formed on the n-type semiconductor layer and a p-type semiconductor layer formed on the active layer; the electrodes are a p-type electrode and a n-type electrode formed on the p-type semiconductor layer and the n-type semiconductor layer with ohmic contacts, respectively.

In view of the above, the stripe-shaped parts on the substrate of the light emitting diode device not only improve the misfit dislocation resulted from the lattice mismatch between the conventional substrate and the epitaxial layer, but also conduct the light transferring horizontally between the n-type semiconductor layer and the p-type semiconductor layer to emit outward from the light emitting diode vertically and thereby converge the light emitting angle into 100~110 degrees. Therefore, the light emitting from the adjacent light emitting diodes can be prevented from being absorbed by each other because of the improved directivity so as to obviously raise the illuminant efficiency.

In addition, the pattern substrate structure of the present invention reduces the total internal reflection angle through the roughness of the substrate surface, and the geometric regions defined by the stripe-shaped parts provide the light reflection effect, such that the illuminant efficiency of the light emitting diode in accordance with the present invention is raised without any conventional reflective cups.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENT

Figure 1:
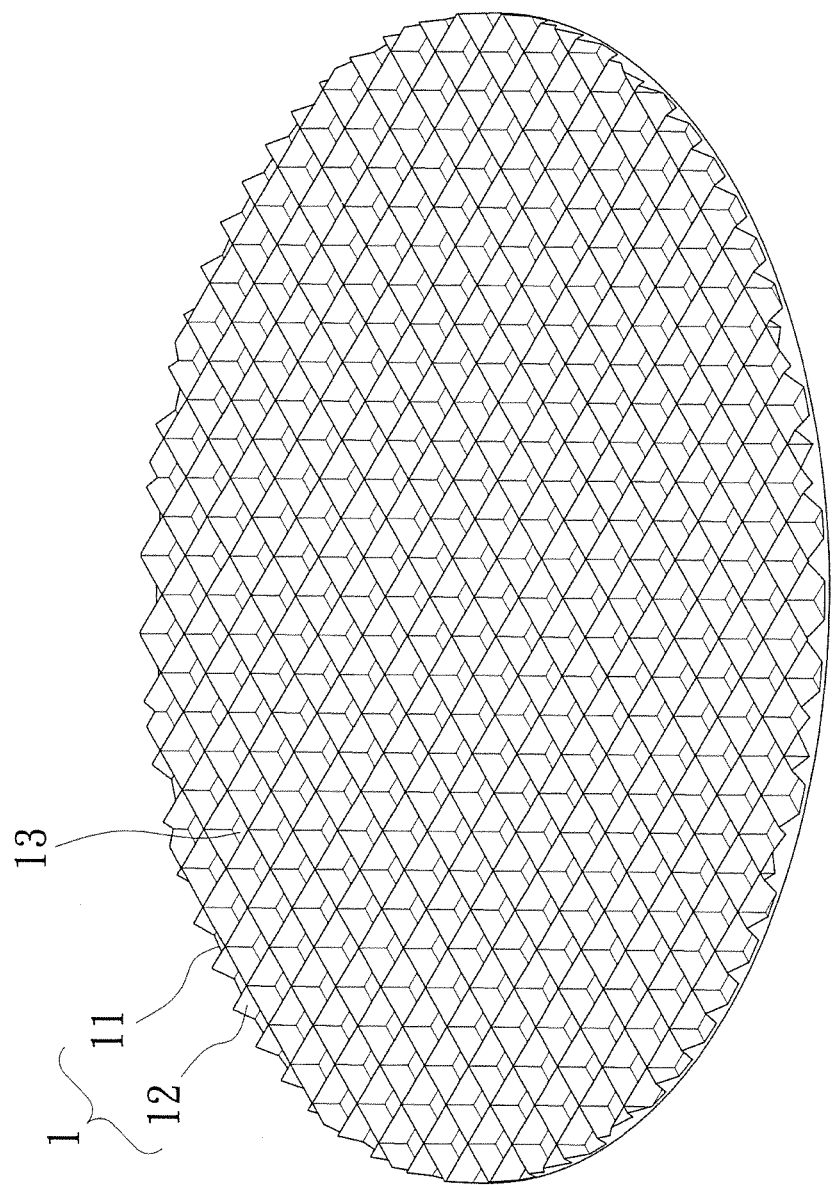
FIG. 1 is a perspective view of the first embodiment of the pattern substrate structure of the present invention.
Figure 2:
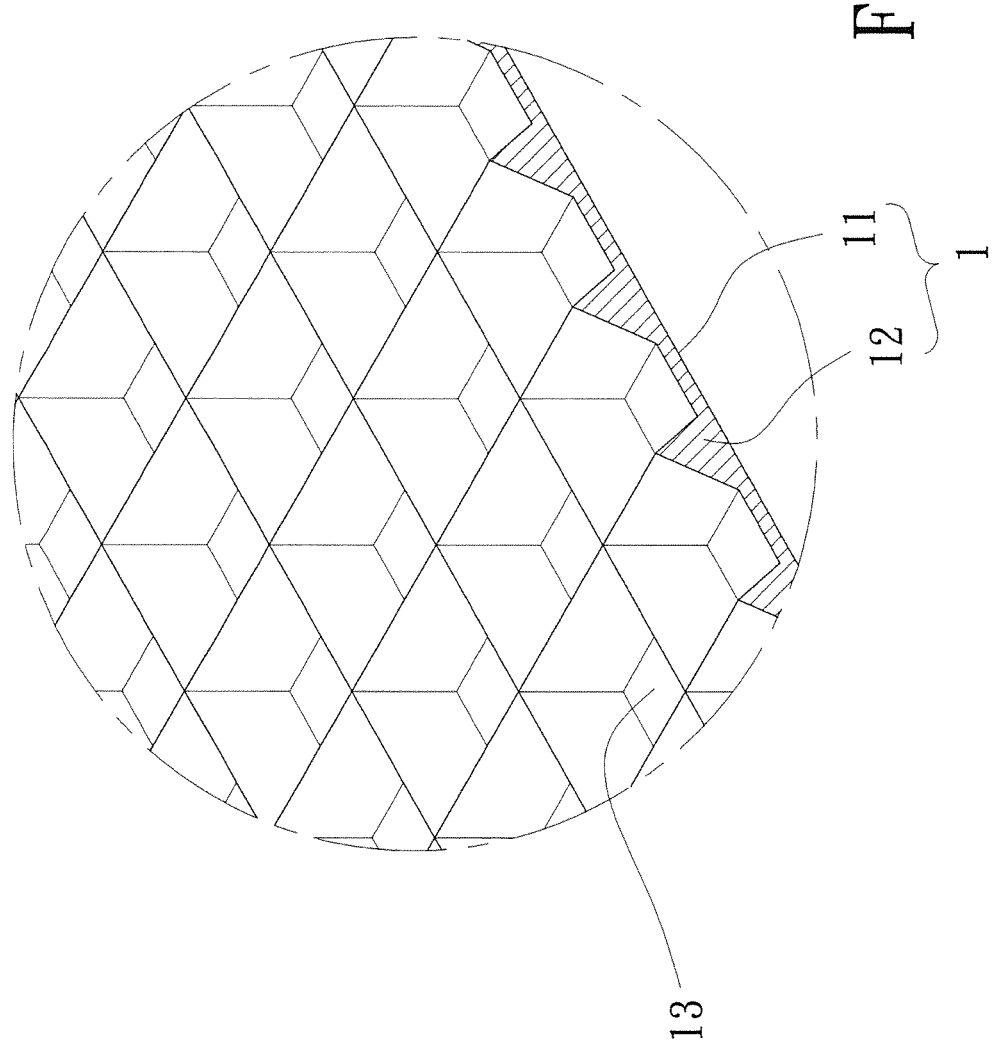
FIG. 2 is a partial perspective cross-section view of the first embodiment of the pattern substrate structure of the present invention.
Figure 3:
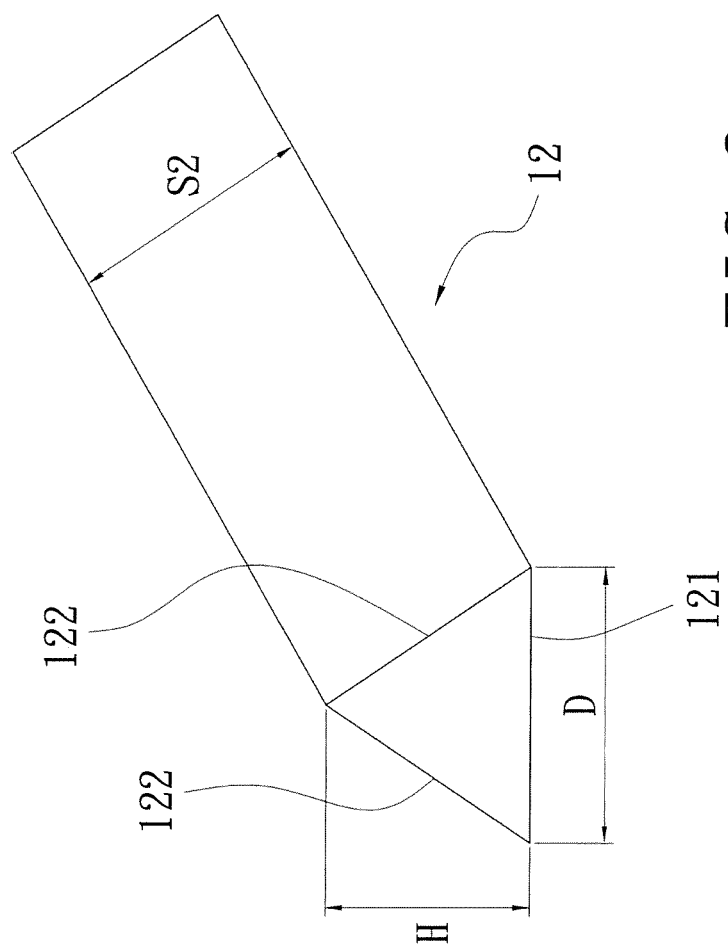
FIG. 3 is a perspective view of the stripe-shaped part of the first embodiment of the present invention.

Refer to FIG. 1 to FIG. 3, a first embodiment of the pattern substrate structure 1 for light emitting angle convergence of the present invention is illustrated. The pattern substrate structure 1 includes a substrate 11 and a plurality of enclosed geometric regions 13 defined by at least three stripe-shaped parts 12, wherein the enclosed geometric regions 13 is in a form of a triangle, a tetragon (e.g. square, rhombus, parallelogram, etc.), a hexagon or a combination thereof. In this embodiment, each enclosed geometric region 13 is in the form of a tetragon; precisely speaking, it is in the form of a square. Each of the stripe-shaped parts 12 has a cross section in a form of a triangle or an arc. In this embodiment, the cross section of each stripe-shaped part 12 is in the form of a triangle, as shown in FIG. 3, to be shown as a triangular pyramid. Moreover, the stripe-shaped parts 12 are formed periodically in the (0001) orientation of the substrate 11, wherein the stripe-shaped parts 12 have the same pitch P defined by the distance between every two adjacent stripe-shaped parts 12 in parallel. In this embodiment, the pitch P is between 1.0 μm and 5.0 μm.

In addition, the substrate 11 is selected from the group consisting of $Al_2O_3$, SiC, Si, GaAs, ZnO and a hexagonal lattice structure material; the stripe-shaped parts are selected from the group consisting of $Al_2O_3$, AlN, SiC, Si and $SiO_2$, wherein $SiO_2$ and AlN will be preferred for the stripe-shaped parts 12. A void is formed on the contact surface between the substrate 11 and the stripe-shaped parts 12 when the material of the substrate 11 is different from that of the stripe-shaped parts 12, e.g. the substrate 11 being composed of $Al_2O_3$ and the stripe-shaped parts 12 composed of $SiO_2$, or AlN. As a result, the light scattering effect can be raised to further enhance the illuminant efficiency of the light emitting diode device. Moreover, the stripe-shaped parts 12 can be formed on the substrate 11 by dry etching or wet etching of the conventional lithography.

In this embodiment, each stripe-shaped part 12 includes a base plane 121 and two symmetrical laterals 122 relative to the perpendicular bisector of the base plane 121. A shortest distance from the junction line of the two laterals 122 to the base plane 121 ranges from 0.5 μm~3.0 μm, i.e. the height H of the stripe-shaped part. The epitaxial growth will be difficult when the height H of the stripe-shaped parts 12 is larger than 3.0 μm. Furthermore, a shortest distance S1 between every two adjacent parallel stripe-shaped parts 12 ranges from 0.1 μm to 1.5 μm, and each stripe-shaped part 12 further has a projection distance D ranging from 1.0 μm to 4.0 μm on the substrate, where a shortest distance S2 extending along one of the two laterals 122 from the junction line of the two laterals 122 to the base plane 121 is 1 to 5 times the shortest distance S1 between every two adjacent parallel stripe-shaped parts 12.

Figure 4:
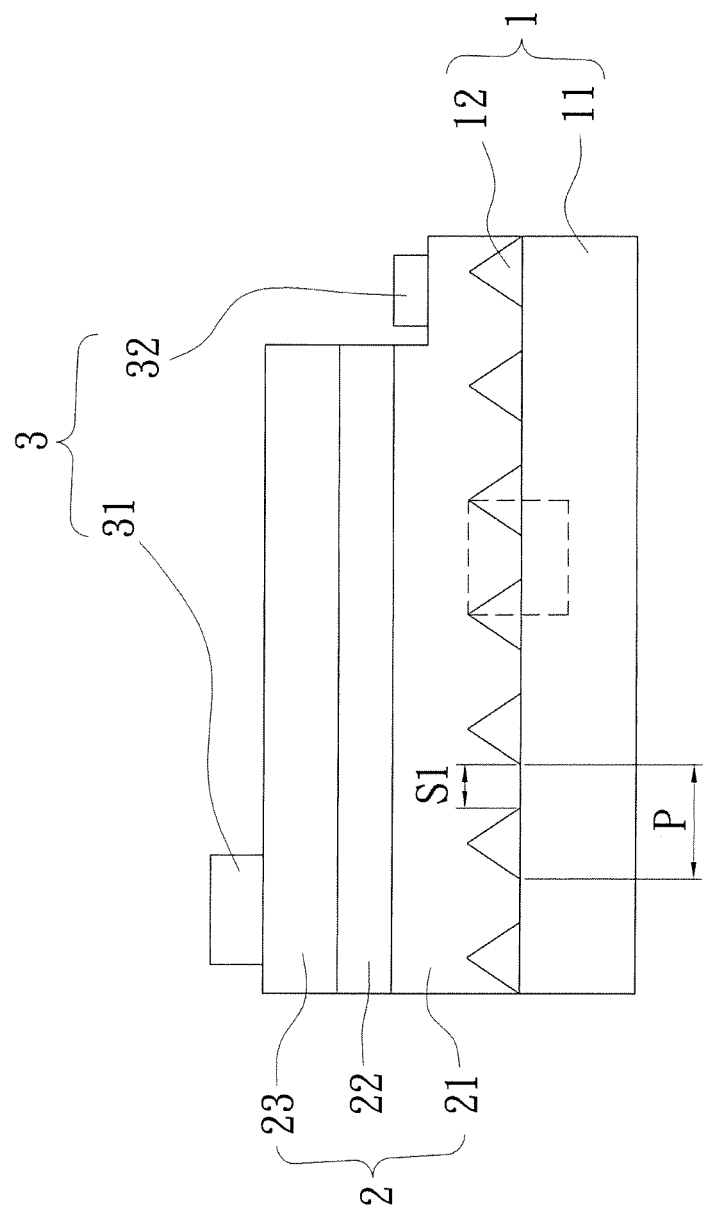
FIG. 4 is a cross-section view of a light emitting diode device of an embodiment of the present invention.

The aforementioned pattern substrate structure 1 can be applied to a light emitting diode device. FIG. 4 illustrates a cross-section view of the light emitting diode device of a first embodiment of the present invention. The light emitting diode device includes the pattern substrate structure 1, an epitaxial film 2 composed of III-Nitride semiconductor material grew on the pattern substrate structure 1 and two electrodes 3 for supply of electricity. The III-Nitride can be AlN, GaN, InN, AlGaN, AlInN, InGaN, AlInGaN or the combination thereof.

In this embodiment, the epitaxial film 2 further includes a n-type semiconductor layer 21, an active layer 22 and a p-type semiconductor layer 23 wherein the type semiconductor layer 21 is formed on the pattern substrate structure 1 and the active layer 22 is formed between the n-type semiconductor layer 21 and the p-type semiconductor layer 23. The electrodes 3 are a p-type electrode 31 and a n-type electrode 32 formed on the p-type semiconductor layer 23 and the n-type semiconductor layer 21 with ohmic contacts, respectively. In order to increase the current diffusion and light extraction efficiency, a transparent conductive layer (not shown) can be formed between the p-type semiconductor layer 23 and the p-type electrode 31. The transparent conductive layer can be selected from the group consisting of indium tin oxide (ITO), aluminum doped zinc oxide (AZO) and indium zinc oxide (IZO).

Figure 5:
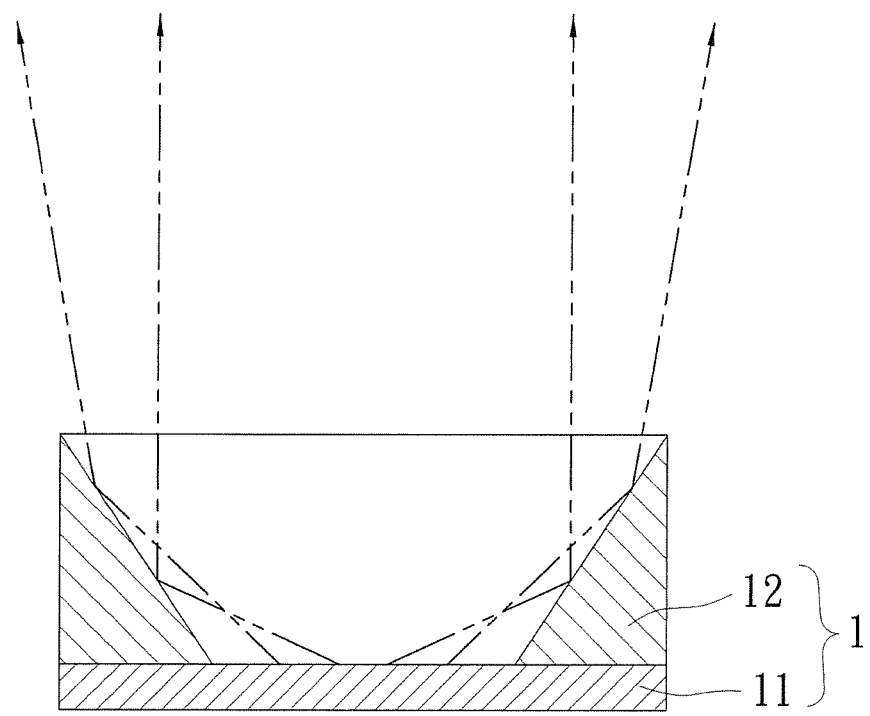
FIG. 5 is a schematic cross-sectional view illustrating a light emitting angle convergence in accordance with the broken-line region of FIG. 4 during operation of the light emitting diode device.

Refer to FIG. 5, it illustrates a schematic cross-sectional view showing light emitting angle convergence in accordance with the broken-line region of FIG. 4 during operation of the light emitting diode device. The misfit dislocation resulted from the lattice mismatch between the conventional substrate 11 and the epitaxial layer 2 can be improved by the stripe-shaped parts 12 on the substrate 11, such that the epitaxial quality of the n-type semiconductor layer 21 can be substantially enhanced. The light transferring horizontally between the n-type semiconductor layer 21 and the p-type semiconductor layer 23 can be conducted to emit outward from the light emitting diode device vertically through the stripe-shaped parts 12 with a triangular cross section and thereby converge the light emitting angle into 100~110 degrees. Thus, the exterior quantum efficiency of the light emitting diode device can be increased and the luminance be raised because of the improved directivity. Moreover, the converged light emitting angle can avoid the undesired occurrence of interaffection of the light emitting from the adjacent light emitting diode devices, which results in deteriorating the illuminant efficiency.

Figure 6:
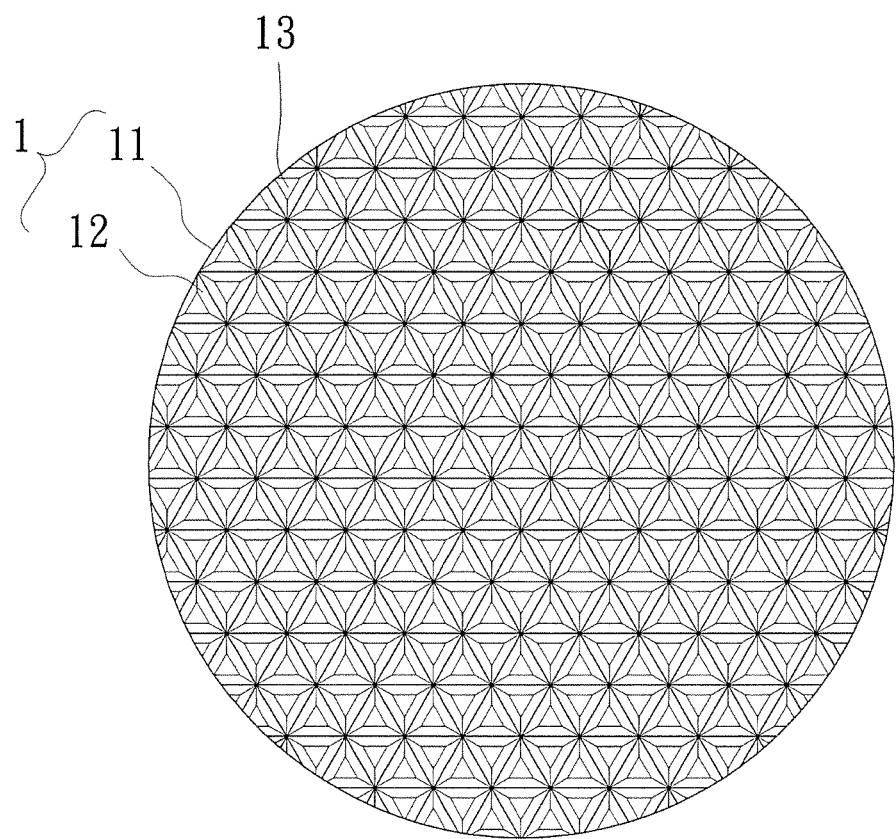
FIG. 6 is a plan view of the second embodiment of the pattern substrate structure of the present invention.
Figure 7:
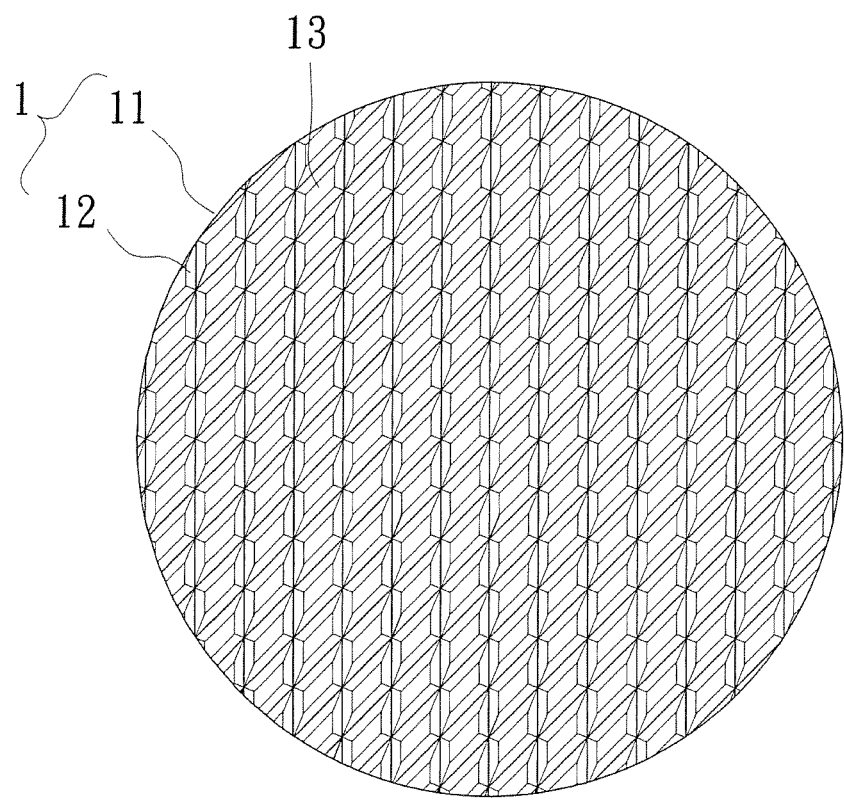
FIG. 7 is a plan view of the third embodiment of the pattern substrate structure of the present invention.
Figure 8:
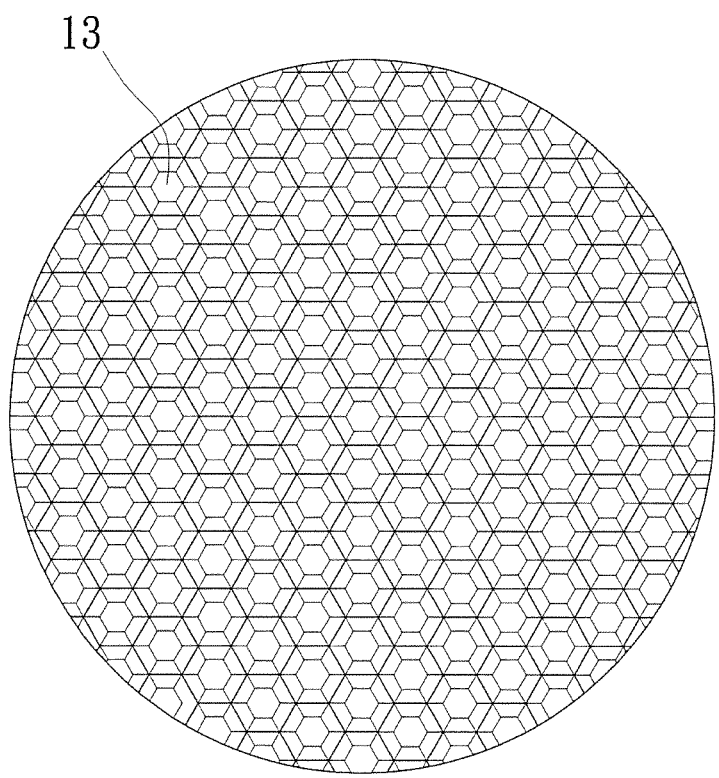
FIG. 8 is a plan view of the fourth embodiment of the pattern substrate structure of the present invention.

Refer to FIGS. 6, 7 and 8, they illustrate the plan views of the second, third and fourth embodiments of the pattern substrate structure 1 of the present invention, respectively. The main difference of these embodiments from the first embodiment is that the enclosed geometric regions 13 defined by the stripe-shaped parts 12 in the form of a triangle, a parallelogram and a hexagon, respectively. In these embodiments, the stripe-shaped parts 12 formed on the substrate 11 have a triangular cross section and are shaped as the same pyramid with that of the first embodiment, so that the effect and the merit thereof are identical to that of the first embodiment, regardless of the configuration of the geometric regions 13 defined by the stripe-shaped parts 12 in the form of a triangle, a tetragon (e.g. rhombus, parallelogram, etc.) or a hexagon.

Figure 9:
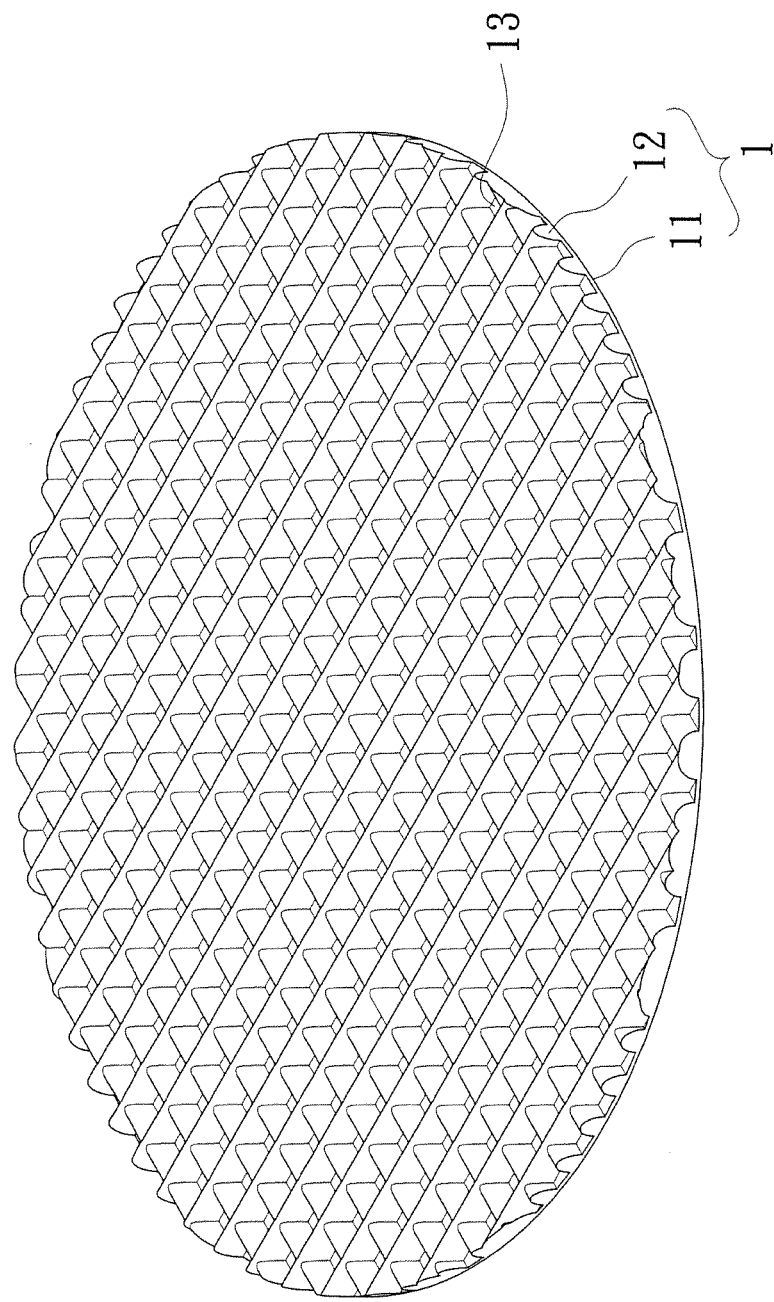
FIG. 9 is a perspective view of the fifth embodiment of the pattern substrate structure of the present invention.
Figure 10:
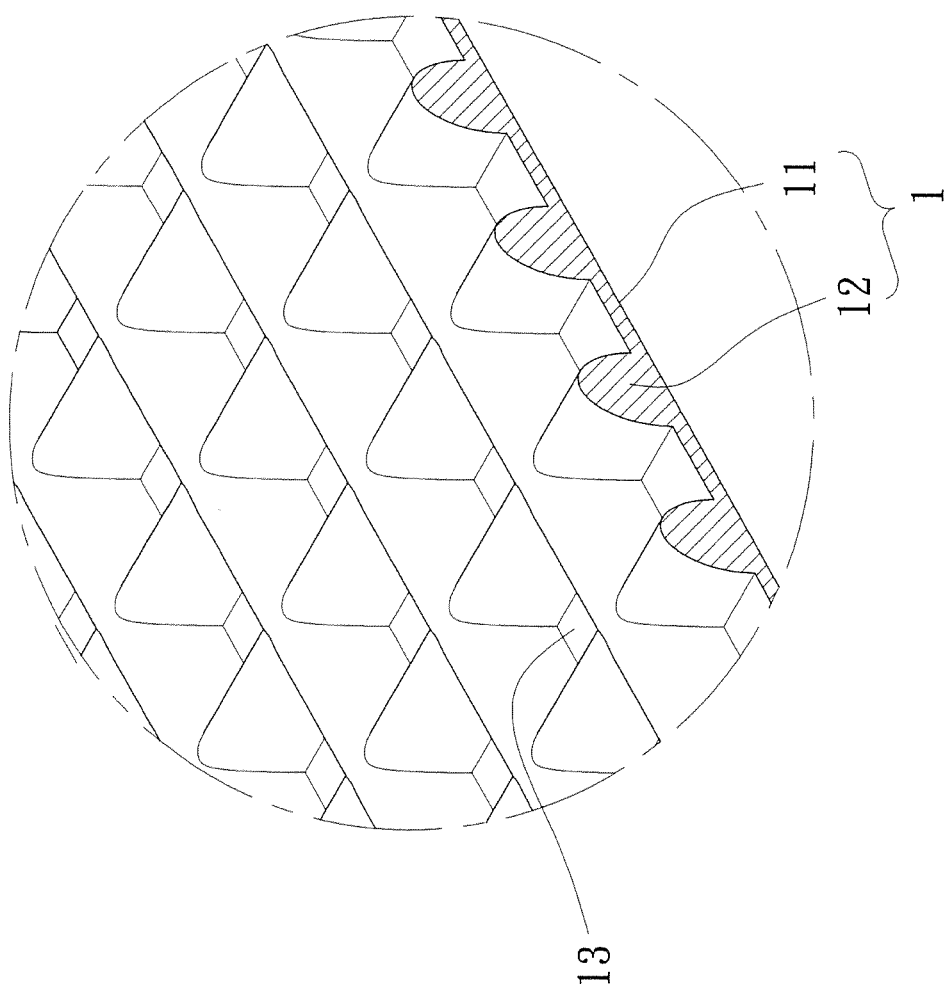
FIG. 10 is a partial perspective cross-section view in accordance with the fifth embodiment of the pattern substrate structure of the present invention.
Figure 11:
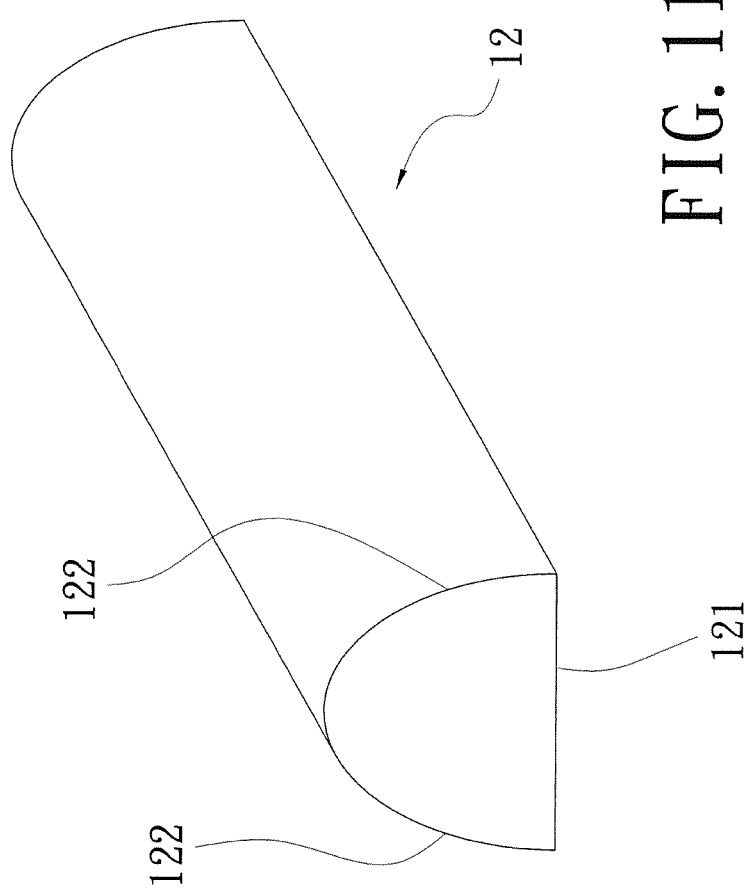
FIG. 11 is a perspective view of the stripe-shaped part in accordance with the fifth embodiment of the present invention.
Figure 12:
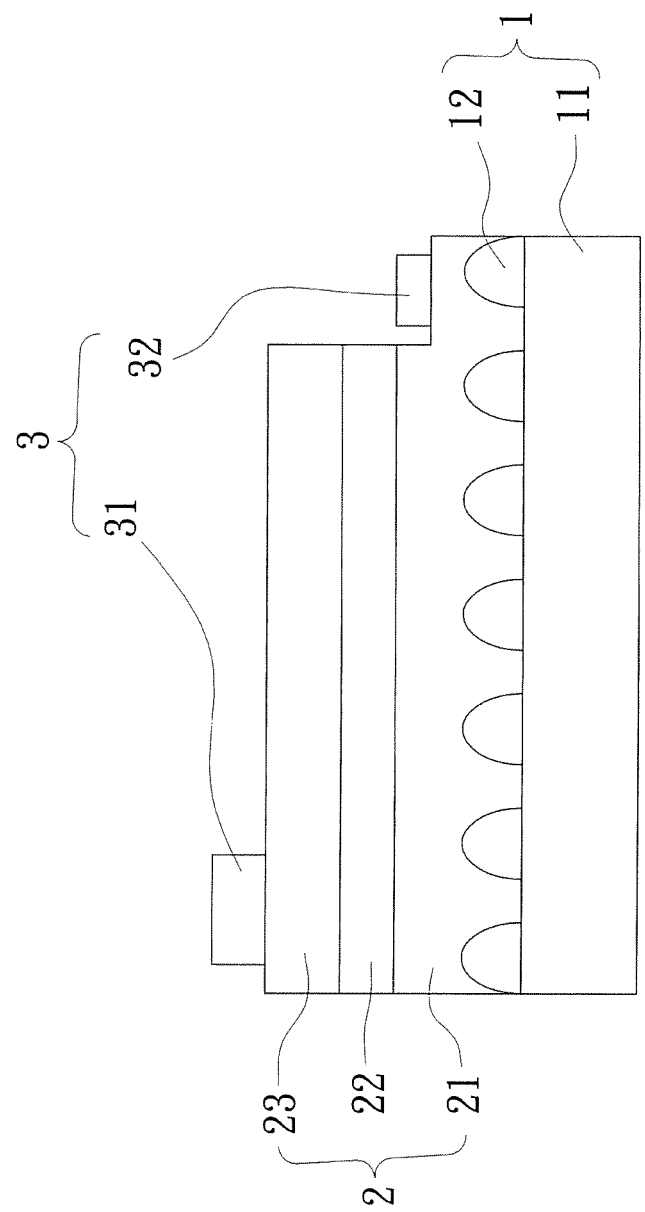
FIG. 12 is a cross-section view of a light emitting diode device in accordance with the fifth embodiment of the present invention.

Refer to FIG. 9, it illustrates the perspective view of the fifth embodiment of the pattern substrate structure 1 of the present invention. The main difference of this embodiment from the first embodiment is that each stripe-shaped part 12 has a cross section in the form of an arc, as shown in FIG. 10. Refer to FIGS. 11 and 12, the curvature of the arc ranges from $10^{-5}\ \mu m^{-1}$ and $2.0\ \mu m^{-1}$, and more preferably from $0.01\ \mu m^{-1}$ to $2.0\ \mu m^{-1}$ for the epitaxial film quality and the light conduction effect. Besides, each enclosed geometric region 13 defined by the stripe-shaped part 12 in this embodiment is in the form of a square. Consequently, the light transferring horizontally between the n-type semiconductor layer 21 and the p-type semiconductor layer 23 can be conducted to emit outward from the light emitting diode device vertically through the stripe-shaped part 12 with a semicircular cross section and thereby converge the light emitting angle into 100~110 degrees. Thus, the luminance and the illuminant efficiency of the light emitting diode device can be substantially raised because of the improved directivity.

In accordance with the aforementioned description of the pattern substrate structure for light emitting angle convergence and the light emitting diode device, the present invention includes the following advantages:

1. The stripe-shaped parts on the substrate of the present invention not only improve the misfit dislocation resulted from the lattice mismatch between the conventional substrate and the epitaxial film but also conduct the light transferring horizontally between the n-type semiconductor layer and the p-type semiconductor layer to emit outward from the light emitting diode device vertically and thereby converge the light emitting angle into 100~110 degrees. Therefore, the light emitting from the adjacent light emitting diode devices can be prevented from being absorbed by each other because of the improved directivity so as to substantially raise the illuminant efficiency.

2. The pattern substrate structure for light emitting angle convergence of the present invention reduces the total internal reflection (TIR) angle through the uneven surface of the substrate, and the enclosed geometric regions defined by the stripe-shaped parts provide the light reflection effect, such that the illuminant efficiency of the light emitting diode device in accordance with the present invention can be raised without any conventional reflective cups.

Although the present invention has been disclosed with reference to the above embodiments, these embodiments are not intended to limit the present invention. It will be apparent to those of skills in the art that various modifications and variations can be made without departing from the spirit and scope of the present invention. Therefore, the scope of the present invention shall be defined by the appended claims.

What is claimed is:

1. A pattern substrate structure for light emitting angle convergence comprising a substrate and a plurality of enclosed geometric regions formed on the surface of the substrate,
    wherein the enclosed geometric regions are defined by at least three stripe-shaped parts; and
    each stripe-shaped part comprises a base plane and two symmetrical laterals relative to the perpendicular bisector of the base plane, where a shortest distance (S2) extending along one of the laterals from the junction line of the two laterals to the base plane is 3.6 to 36 times the shortest distance (S1) between every two adjacent stripe-shaped parts in parallel.

2. The pattern substrate structure for light emitting angle convergence as claimed in claim 1, wherein each geometric region is in a form selected from the group consisting of a triangle, a tetragon and a hexagon.

3. The pattern substrate structure for light emitting angle convergence as claimed in claim 1, wherein the stripe-shaped parts are formed on the surface of the substrate in a periodical manner and have the same pitch between every two adjacent stripe-shaped parts in parallel.

4. The pattern substrate structure for light emitting angle convergence as claimed in claim 3, wherein the pitch ranges from 1 μm to 5 μm.

5. The pattern substrate structure for light emitting angle convergence as claimed in claim 1, wherein each stripe-shaped part has a cross section in a form of a triangle or an arc.

6. The pattern substrate structure for light emitting angle convergence as claimed in claim 5, wherein the arc has a curvature ranging from $10^{-5}\ \mu m^{-1}$ to $2.0\ \mu m^{-1}$.

7. The pattern substrate structure for light emitting angle convergence as claimed in claim 1, wherein the stripe-shaped parts are formed in a (0001) orientation of the substrate.

8. The pattern substrate structure for light emitting angle convergence as claimed in claim 1, wherein the substrate is composed of the material selected from the group consisting of $Al_2O_3$, SiC, Si, GaAs, ZnO and a hexagonal lattice structure material.

9. The pattern substrate structure for light emitting angle convergence as claimed in claim 1, wherein the stripe-shaped parts are composed of the material selected from the group consisting of $Al_2O_3$, AlN, SiC, Si and $SiO_2$.

10. The pattern substrate structure for light emitting angle convergence as claimed in claim 9, wherein the stripe-shaped parts are composed of $SiO_2$ or AlN.

11. The pattern substrate structure for light emitting angle convergence as claimed in claim 1, wherein each stripe-shaped part has a height ranging from 0.5 μm to 3.0 μm.

12. The pattern substrate structure for light emitting angle convergence as claimed in claim 1, wherein each stripe-shaped part has a projection distance ranging from 1.0 μm to 4.0 μm by projection of the same on the substrate.

13. The pattern substrate structure for light emitting angle convergence as claimed in claim 1, wherein a shortest distance between every two adjacent stripe-shaped parts in parallel ranges from 0.1 μm to 1.5 μm.

14. A light emitting diode device, comprising:
    a pattern substrate structure;
    an epitaxial film composed of III-Nitride semiconductor material grew on the pattern substrate structure; and two electrodes for supply of electricity;
wherein the pattern substrate structure comprises a plurality of enclosed geometric regions defined by at least three stripe-shaped parts formed on the surface of the substrate; and
each stripe-shaped part comprises a base plane and two symmetrical laterals relative to the perpendicular bisector of the base plane, where a shortest distance (S2) extending along one of the laterals from the junction line of the two laterals to the base plane is 3.6 to 36 times the shortest distance (S1) between every two adjacent stripe-shaped parts in parallel.

15. The light emitting diode device as claimed in claim 14, wherein the epitaxial film comprises an n-type semiconductor layer formed on the pattern substrate structure, an active layer formed on the n-type semiconductor layer and a p-type semiconductor layer formed on the active layer; the electrodes are a p-type electrode and a n-type electrode formed on the p-type semiconductor layer and the n-type semiconductor layer with ohmic contacts, respectively.

16. The light emitting diode device as claimed in claim 15, wherein a transparent conductive layer is formed between the p-type semiconductor layer and the p-type electrode.

17. The light emitting diode device as claimed in claim 16, wherein the material of the transparent conductive layer is selected from the group consisting of indium tin oxide (ITO), aluminum doped zinc oxide (AZO) and indium zinc oxide (IZO).

18. The light emitting diode device as claimed in claim 14, wherein the III-Nitride is AlN, GaN, InN, AlGaN, AlInN, InGaN, AlInGaN or the combination thereof.

* * * * *